(12) United States Patent
Hirota

(10) Patent No.: US 6,331,959 B1
(45) Date of Patent: Dec. 18, 2001

(54) SEMICONDUCTOR MEMORY DEVICE AND CONTROL METHOD THEREOF

(75) Inventor: Takuya Hirota, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/525,611

(22) Filed: Mar. 14, 2000

(30) Foreign Application Priority Data

Mar. 17, 1999 (JP) .................................................. 11-071551

(51) Int. Cl.[7] ....................................................... G11C 7/00
(52) U.S. Cl. ......................... 365/207; 365/203; 365/208; 365/205
(58) Field of Search .................................. 365/205, 207, 365/208, 203

(56) References Cited

U.S. PATENT DOCUMENTS

| | | | |
|---|---|---|---|
| 4,961,168 | * 10/1990 | Tran .................................. | 365/189.11 |
| 5,050,127 | * 9/1991 | Mitsumoto et al. ............ | 365/189.09 |
| 5,566,126 | * 10/1996 | Yoshida ................................ | 365/208 |
| 5,835,427 | * 11/1998 | McClure ............................... | 365/201 |

FOREIGN PATENT DOCUMENTS

| | | |
|---|---|---|
| 02-294991 | 5/1990 | (JP) . |
| 08-007573 | 1/1996 | (JP) . |

OTHER PUBLICATIONS

English Abstract of JP 02–294991 and 08–007573 noted above.
Copy of Japanese Patent Office Action dated Jul. 3, 2001 regarding corresponding foreign application.
English translation of indicated portions of above Japanese Patent Office Action.

* cited by examiner

*Primary Examiner*—Son T. Dinh
(74) *Attorney, Agent, or Firm*—Darryl G. Walker

(57) ABSTRACT

A semiconductor storage device is disclosed that can lower sense amplifier input potentials to about a half supply potential (VCC/2) to speed up sense amplifier operations. According to one embodiment, a semiconductor storage device (100) may include a pair of digit lines (104 and 106), a memory cell (108) that can place stored data on digit lines (104 and 106), a sense amplifier (112) that may read memory cell data on digit lines (104 and 106), and switching devices (120-*a* and 120-*b*) connected between sense amplifier inputs (112-*a* and 112-*b*) and digit lines (104 and 106). Digit lines (104 and 106) may be precharged to a high potential. Memory cell data may then be placed on the digit lines (104 and 106). Prior to the activation of the sense amplifier (112) switching devices (120-*a* and 120-*b*) may lower the digit line potentials to a level more conducive to sensing by the sense amplifier (112). In this way, a read operation by the sense amplifier (112) may be faster than conventional approaches.

19 Claims, 6 Drawing Sheets

SEMICONDUCTOR MEMORY DEVICE AND CONTROL METHOD THEREOF

TECHNICAL FIELD

The present invention relates generally to semiconductor storage devices and more particularly to semiconductor storage devices having dynamic sense amplifiers, and methods of controlling such devices.

BACKGROUND OF THE INVENTION

Currently, widely used high-speed memory devices include static random access memories (SRAMs). SRAMs typically include memory cells that place data signals on at least one data line. Such signals are typically a very small variation in potential.

One common way to detect small memory cell data signals is with a dynamic sense amplifier. A dynamic sense amplifier may include a sense amplifier that is controlled according to a dynamic timing signal.

In many arrangements, digit lines may be precharged to high potential relative to the memory device. As but one example, a digit line may be precharged at or very close to a high power supply level (VCC). More particularly, a memory device may precharge two complementary bit lines to a VCC level. Subsequently, a data signal may drive one bit line to a slightly lower level while the other bit line essentially maintains the high level.

A particular example of memory device is shown in FIGS. 6 and 7. A memory device can include a precharge and equalize circuit that includes p-channel metal-oxide-semiconductor (PMOS) precharge transistors 600 and 602 and a PMOS equalize transistor 604. Such a circuit may precharge and equalize complementary bit lines 606 and 608 according to an equalize signal EQ. A word line 610 may connect a memory cell 612 to complementary digit lines (606 and 608) and thus place data signals on the complementary digit lines (606 and 608). A word line 610 may receive a word line signal Word.

Complementary digit lines (606 and 608) can be connected to a sense amplifier 614 by way of a transfer gate circuit that includes PMOS transfer gate transistors 616 and 618. Transfer gate transistors (616 and 618) may be commonly activated by a select signal Yj.

The sense amplifier 614 may include cross-coupled inverter sections 614-a and 614-b. A first sense amplifier input node 614-c can be connected to the output of inverter section 614-a and the input of inverter 614-b. Similarly, a second sense amplifier input node 614-d can be connected to the output of inverter section 614-b and the input of inverter section 614-a.

The sense amplifier 614 may be dynamically activated by an n-channel MOS (NMOS) supply transistor 620. NMOS supply transistor 620 may be activated by a sense enable signal SE1.

FIG. 7 shows a timing diagram illustrating a read operation for the circuit of FIG. 6. Prior to time T1, an equalize signal (EQ) is active (low) while a word line signal (Word) is inactive (low).

At time T1, the word line signal (Word) is activated while the equalize signal (EQ) is deactivated. Consequently, the precharge and equalization circuit (600, 602 and 604) is disabled while the memory cell 612 is connected to digit line pairs (606 and 608). Also at time t1, a select signal Yj is activated, turning on transfer gate transistors (616 and 618) and connecting digit line pairs (606 and 608) to sense amplifier inputs (614-c and 614-d). In this way, a memory cell data signal can be generated on digit line pairs (606 and 608) and supplied to a sense amplifier 614. A memory cell data signal can result in the generation of a small differential voltage across the digit lines (606 and 608).

At time T2, the sense amplifier signal SE1 is activated (driven high). The activation of the SE1 signal activates the sense amplifier 614. This can result in the digit line differential falling toward the low power supply voltage.

At time T3 a digit line potential has been amplified by a sense amplifier 614 to a predetermined magnitude.

A drawback to an arrangement such as that set forth in FIGS. 6 and 7 is the response of the sense amplifier 614. Due to threshold voltages of inverter sections (614-a and 614-b), when digit lines (606 and 608) are precharged to a high level, the time it may take sense voltage levels can add considerably to overall data sensing times.

It would be desirable to arrive at some way of improving the sense time of fast semiconductor devices. In particular it would be desirable to improve the sensing speed of a semiconductor device that includes a sense amplifier having an inverter section and one or more digit lines that are precharged to a high potential.

SUMMARY OF THE INVENTION

A memory device according to one embodiment of the present invention may include a pair of digit lines, a memory cell that places a data signal on the pair of digit lines, and a sense amplifier that can read data from the memory cell. A memory device may further include a switch circuit that connects at least one sense amplifier input to a predetermined potential to place the input at an intermediate potential with respect to sensed logic levels.

According to one aspect of the embodiments, the digit lines may be precharged to a first supply potential and a switch circuit can provide a connection to a second supply potential that is different from the first supply potential. The intermediate potential may be between the first supply potential and the second supply potential. A first supply potential may be a high power supply voltage. A second supply potential may be a low power supply voltage.

According to another aspect of the embodiments, the switch circuit may be activated prior to the sense amplifier, bringing digit lines to a potential that may allow for faster sensing.

According to another aspect of the embodiments, a switch circuit may be activated according to a timing signal. The timing signal may be a pulse of a predetermined duration.

According to another aspect of the embodiments, a switch circuit may include a NMOS transistor.

According to another aspect of the embodiments, a switch circuit may include a PMOS transistor.

According to another aspect of the embodiments, a switch circuit may include a bipolar transistor.

According to another aspect of the embodiments, a method of controlling a semiconductor storage device may include providing a semiconductor device with a pair of digit lines, a memory cell that supplies data signals to the digit lines, a sense amplifier that reads data from the memory cell, and a switch circuit connected to sense amplifier inputs.

Such a method may further include selecting the memory cell. The digit lines may then be pulled toward a first predetermined potential, and released from the first predetermined potential when they are about one half of a power supply voltage.

According to one aspect of the above control method embodiment, a sense amplifier can latch a data signal from a memory cell after the digit lines are about one half the power supply voltage.

DETAILED DESCRIPTION OF THE EMBODIMENTS

Various embodiments of a semiconductor storage device according to the present invention will now be described with reference to a number of figures. A semiconductor storage device according to the embodiments may include a high-speed static random access memory (SRAM), or the like. Such a semiconductor storage device may include a pair of digit lines that can be connected to a dynamic sense amplifier. The digit line may be initially placed at a first potential. A first potential may be at or near a power supply potential.

In a sense operation, the digit line potential may be placed at a "sense" potential more conducive to rapid sensing of the data value prior to the activation of the sense amplifier. Such an operation may include connecting the digit lines and/or the inputs of the sense amplifier to a predetermined potential. As one example, if a high power supply voltage is VCC a sense potential may be at around VCC/2. Of course, while a value of VCC/2 has been presented as one example of a sense potential, other values may be used according to the response of a particular sense amplifier circuit. By placing the sense amplifier inputs and/or digit line pair at the sense potential, faster sensing operation can occur.

One way in which the sense amplifier inputs may be placed at a sense potential is with transistors. As but one example, switch transistors may be connected between sense amplifier inputs and a predetermined potential. Such switch transistors may be activated by a pulse control signal. More particularly, digit lines may be precharged to a high power supply level (VCC) and n-channel switch transistors may connect sense amplifier inputs to a lower power supply level (GND) according to a pulse control signal. Of course, transistors represent but one example of a structure for adjusting sense amplifier and/or digit lines to a sense potential.

Figure 1:
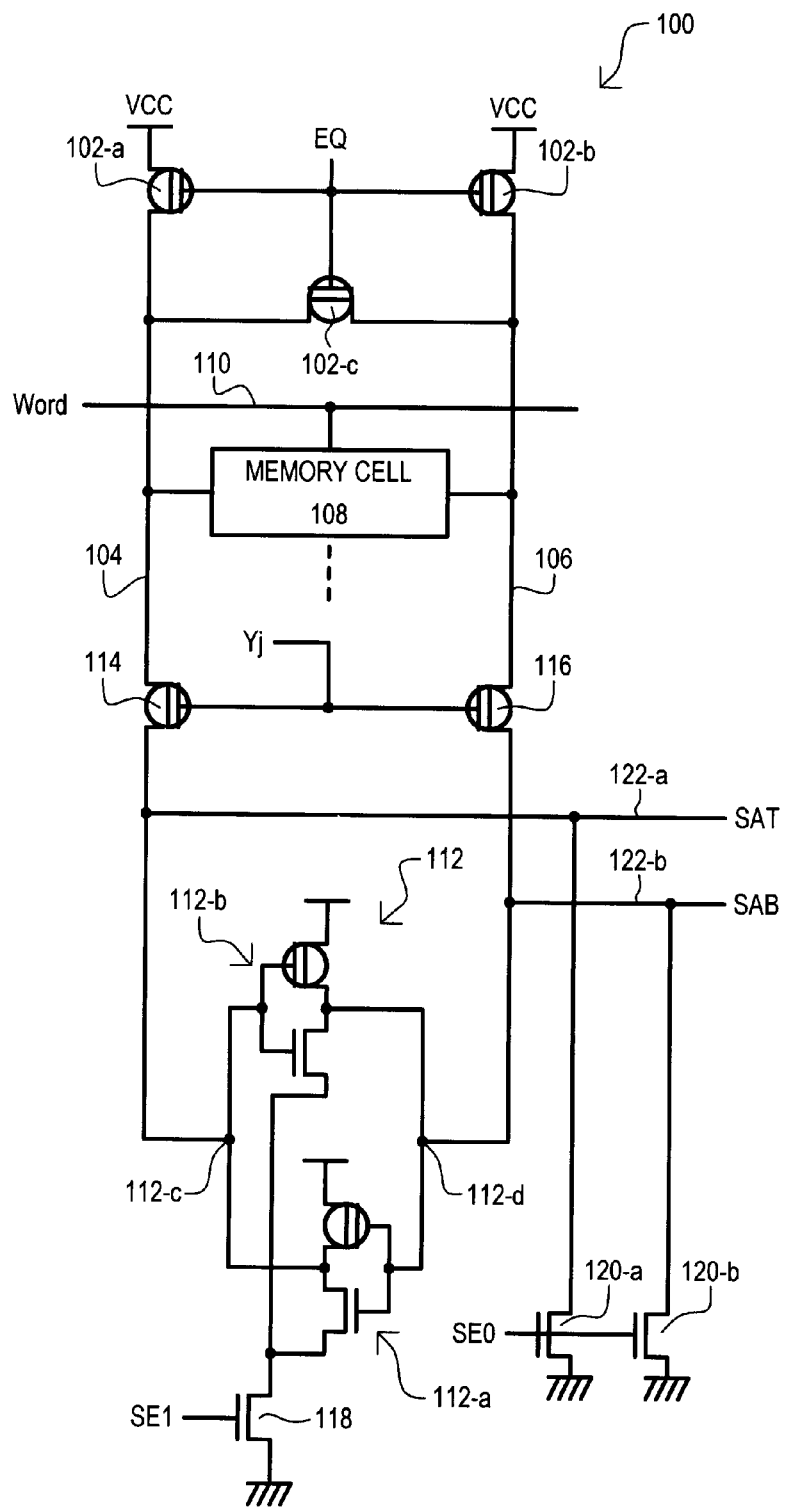
FIG. 1 a circuit diagram of a first embodiment.

Referring now to FIG. 1, a circuit diagram shows a semiconductor storage device according to a first embodiment. The semiconductor storage device is designated by the general reference character 100 and is shown to include a precharge and equalize circuit having precharge transistors 102-*a* and 102-*b* and equalize transistor 102-*c*. In the particular example of FIG. 1, digit lines 104 and 106 can be precharged to a high VCC potential, and precharge and equalize transistors (102-*a* to 102-*c*) can be p-channel insulated gate field effect transistors (IGFETs).

Precharge transistors 102-*a* and 102-*b* can have source-drain paths connected between a high power supply VCC and digit lines 104 and 106. Equalize transistor 102-*c* can have a source-drain path between digit lines 104 and 106. The gates of the precharge and equalize transistors (102-*a* to 102-*c*) may be commonly connected to a precharge and equalize signal (EQ).

A memory cell 108 may be connected to digit line pair (104 and 106) and selected by a word line signal (Word) on a word line 110. When a word line signal (Word) is active, a memory cell 108 can place a data signal on digit line pair (104 and 106).

Digit line pair (104 and 106) may be connected to a sense amplifier 112 by a transfer circuit that can include transfer gate transistors 114 and 116. Transfer gate transistors (114 and 116) may be commonly activated by a select signal Yj. In the particular arrangement of FIG. 1, transfer gates transistors are p-channel IGFETs having source-drain paths coupled between digit line pair (104 and 106) and sense amplifier 112. A select signal Yj may be a "Y-select" signal that selects one or more particular columns in a memory array.

In some arrangements, transfer circuit may include another set of transfer gate transistors (not shown) situated between transfer gate transistors (114 and 116) and sense amplifier 112. Such an arrangement can be used to prevent fully amplified logic levels provided by sense amplifier 112 from being transmitted back to digit lines 104 and 106. Such devices have been omitted from FIG. 1 in order to provide a more simplified view.

A sense amplifier 112 may include cross-coupled inverter sections 112-*a* and 112-*b*. Inverter section 112-*a* may have an output connected to a first sense amplifier input node 112-*c* and an input connected to a second sense amplifier input node 112-*d*. Conversely, inverter section 112-*b* may have an output connected to a second sense amplifier input node 112-*d* and an input connected to a first sense amplifier input node 112-*c*.

A sense amplifier 112 may be activated according to a supply device 118. A supply device 118 can enable a current path between the sense amplifier 112 and a sense supply potential. In the particular arrangement of FIG. 1, a supply device 118 is an n-channel IGFET that enables a current path between sense amplifier 112 and a low power supply (GND). Further, the supply device 118 is enabled by a sense enable signal SE1. Supply device 118 can have a drain connected to the sources of n-channel IGFETs in inverter sections 112-*a* and 112-*b*, and a source connected to a low power supply (GND).

The first embodiment 100 is shown to further include switching devices 120-*a* and 120-*b*. Switching devices (120-*a* and 120-*b*) can adjust the potential of the sense amplifier inputs (112-*c* and 112-*d*) and/or digit line pair (114 and 116) to a sense potential that may allow for faster sense times. In one particular arrangement, switching devices (120-*a* and 120-*b*) can provide a low impedance path between sense amplifier inputs (112-*c* and 112-*d*) and an adjusting potential. More particularly, switching devices (120-*a* and 120-*b*) may include n-channel IGFETs that can provide a low impedance path to a low power supply potential (GND). The switching devices (120-*a* and 120-*b*) are commonly controlled by a sense enable pulse SE0.

In the arrangement of FIG. 1, sense amplifier input nodes (112-*c* and 112-*d*) may provide amplified output signals on output signal lines 122-*a* and 122-*b*. Output signals are shown in FIG. 1 as SAT and SAB. Thus, in FIG. 1, switching devices 120-*a* and 120-*b* are shown connected to output signal lines 122-*a* and 122-*b*. In particular, switching devices (120-*a* and 120-*b*) have source-drain paths connected between output signal lines (122-*a* and 122-*b*) and a low power supply (GND).

Figure 2:
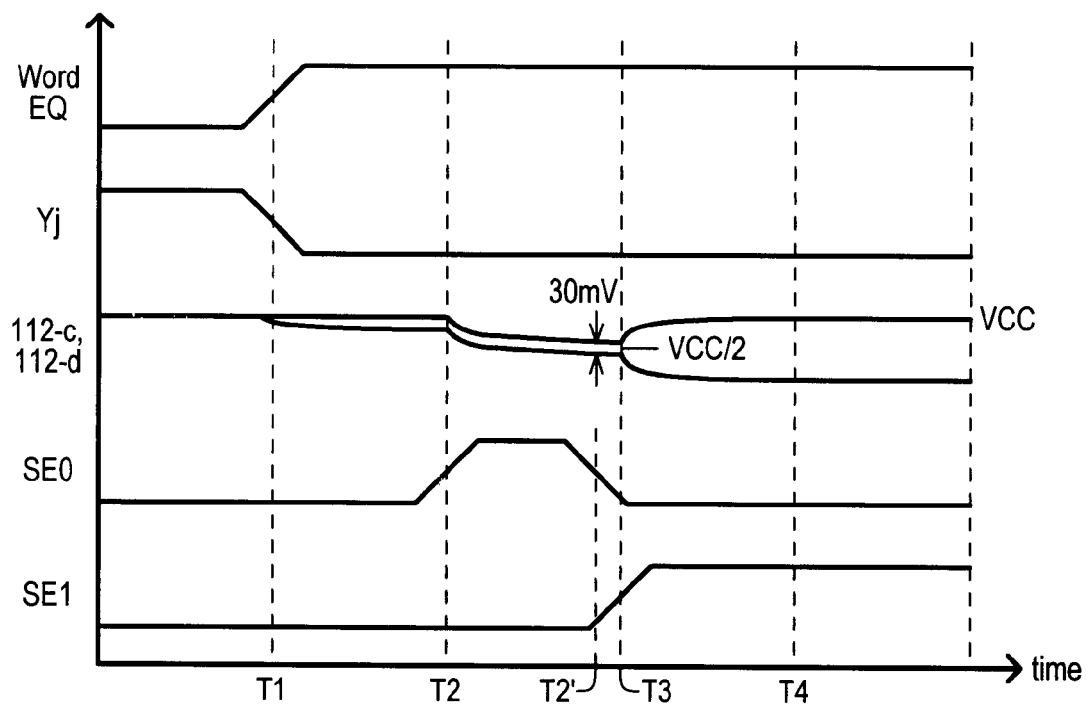
FIG. 2 is a timing diagram illustrating the operation of the first embodiment.

Having described one arrangement for a first embodiment, the operation of the first embodiment will now be described with reference to FIG. 2. FIG. 2 is a timing diagram showing the response of various signals and nodes in a read operation. FIG. 2 includes a "Word/EQ" waveform that illustrates the response of a word line and an equalization signal, a "Yj" waveform that illustrates the response of a select signal, a "112-*a*/112-*b*" waveform that illustrates the response of sense amplifier inputs (112-*a*/112-*b*), a "SE0" waveform that illustrates the response of a sense amplifier enable pulse, and a "SE1" signal that illustrates the response of a sense amplifier enable signal.

Before time T1, the EQ and Word signals are low. Consequently, the word line 110 is inactive and the precharge and equalization circuit (102-*a* to 102-*c*) is active. With the precharge and equalization circuit active (102-*a* to 102-*c*) digit lines 104 and 106 are placed at the high power supply level VCC. The Yj signal is high, turning off transfer gate transistors 114 and 116, thus isolating the sense amplifier 112 from the digit lines (104 and 106).

Also at time T1, the SE0 signal is low, keeping switching devices 120-*a* and 120-*b* off. Similarly, the SE1 signal is low, isolating the sense amplifier 112 from the low power supply (GND). This can result in sense amplifier inputs 112-*c* and 112-*d* being high. It is noted that sense amplifier inputs (112-*c* and 112-*d*) may also be precharged high by precharge circuits connected to the sense amplifier inputs (112-*c* and 112-*d*) and/or to output signal lines 122-*a* and 122-*b*.

At time T1 a read operation can start. The Word and EQ signals can transition high, activating the word line signal Word and deactivating the EQ signal. With EQ deactivated, precharge and equalize circuit (102-*a* to 102-*c*) can be turned off, isolating digit lines (104 and 106) from precharge potential VCC. With the word line signal Word activated, memory cell 108 can be connected to digit lines (104 and 106) thereby generating a relatively small voltage differential thereon. In the particular example of FIG. 2, the voltage differential is shown to be about 30 mV.

At the same time, select signal Yj is activated, connecting digit lines (104 and 106) to sense amplifier inputs 112-*c* and 112-*d*. Consequently, at time T1, the voltage differential is shown at the sense amplifier inputs (112-*c* and 112-*d*).

At time T2, sense amplifier enable pulse SE0 transitions high, turning on switching devices 120-*a* and 120-*b*. As a result, sense amplifier inputs (112-*c* and 112-*d*) are drawn toward the ground (GND) potential. However, because switching devices (120-*a* and 120-*b*) can be formed identically and/or provide equivalent impedance, the small voltage differential at the sense amplifier inputs (112-*c* and 112-*d*) can be maintained.

In the arrangement of FIG. 2, the SE0 pulse begins at time T2 and concludes at time T2'. According to one particular approach, the pulse width T2–T2' and gate widths of switching devices (120-*a* and 120-*b*) can be set to bring sense amplifier inputs (112-*c* and 112-*d*) to a particular sense potential. In FIG. 2, this level is about VCC/2. In particular, ideally, a VCC/2 level will be a middle point of the small voltage differential.

Of course, it is understood that the sense potential is optimized for a particular sense amplifier configuration. For other sense potentials the size of switching devices (120-*a* and 120-*b*) and/or the duration of the SE0 pulse can be adjusted accordingly.

Preferably, the conclusion of the pulse (time T2') occurs prior to, or concurrent with, the activation of the sense amplifier (time T3).

At time T3, the sense amplifier inputs (112-*c* and 112-*d*) can be drawn to about the desired sense potential (VCC/2 in the example of FIG. 2) and have a desired voltage differential (30 mV in the example of FIG. 2). The sense amplifier select signal SE1 can transition high, activating the sense amplifier 112. When activated, sense amplifier 112 can amplify the small voltage differential.

At time T4, the sense amplifier 112 has essentially fully amplified the voltage differential resulting in a large voltage differential between sense amplifier inputs (112-*c* and 112-*d*).

Figure 7:
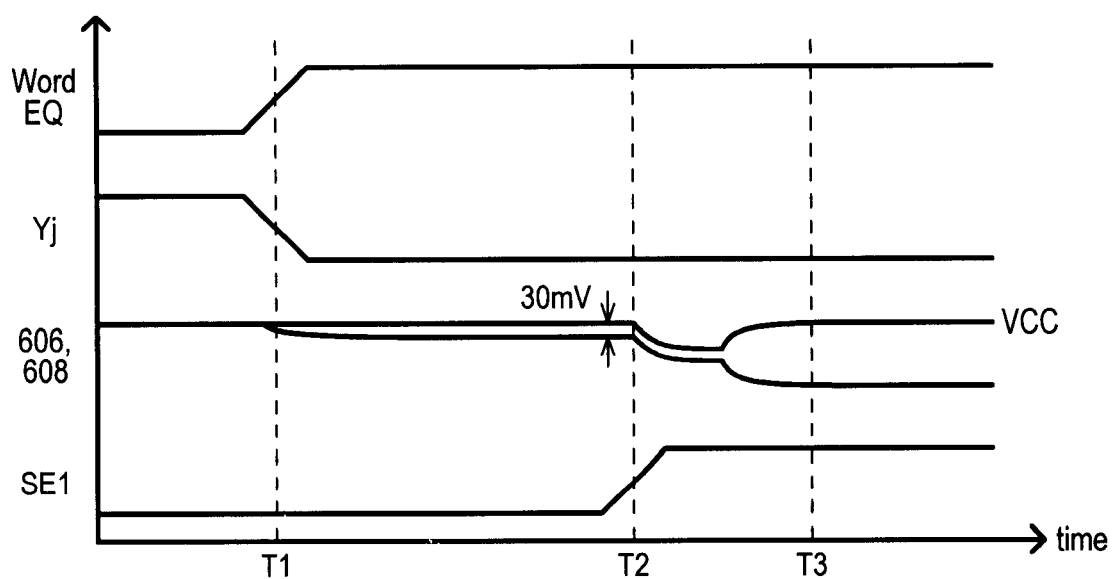
FIG. 7 is a timing diagram illustrating the operation of conventional memory device of FIG. 6.

A comparison can be made between the timing diagram of FIG. 2 and the conventional case of FIG. 7. While both responses are initially the same, the response of FIG. 2 may reach a fully amplified data state faster than the conventional approach of FIG. 2. More particularly, in the response of FIG. 2 and the conventional response, the digit lines will have a differential voltage for a given period of time. However, in the conventional case of FIG. 7, the digit lines remain at about the VCC level until the sense amplifier is activated. The digit lines then fall toward a VCC level and are amplified. In contrast, in the response of FIG. 2, digit lines can fall toward VCC/2 prior to the activation of the sense amplifier. Consequently, when the sense amplifier is activated, it can provide an amplified signal in a shorter amount of time. This can lead to faster read times.

Figure 3:
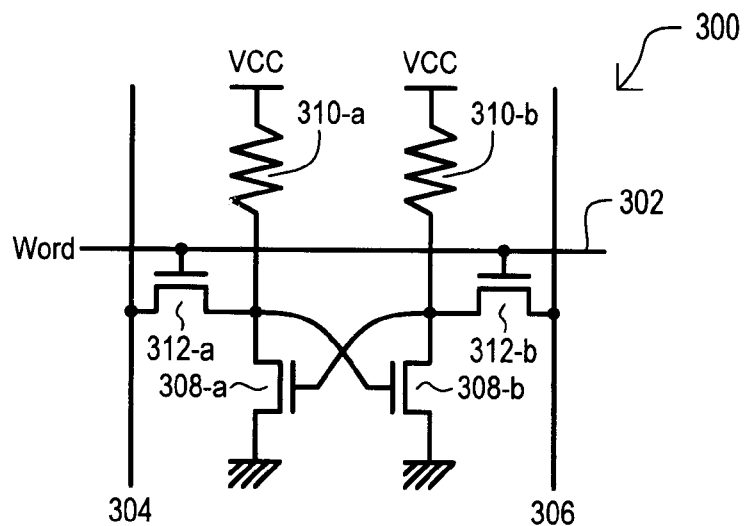
FIG. 3 is a circuit diagram of a memory cell that may be included in the various embodiments.

FIG. 3 provides one example of a memory cell that may be used in the various embodiments. The memory cell 300 may be connected to a word line 302, that may correspond to word line 110 of FIG. 1, and to a digit lines 304 and 306, that may correspond to digit line pair 104 and 106 of FIG. 1. A memory cell 300 may further include cross-coupled n-channel IGFETs 308-*a* and 308-*b* and pull-up resistors 310-*a* and 310-*b*. A data value stored within memory cell 300 can be placed on digit lines 304 and 306 by pass transistors 312-*a* and 312-*b*. Pass transistors (312-*a* and 312-*b*) may be commonly activated by a word line signal (Word) on word line 302.

Figure 4:
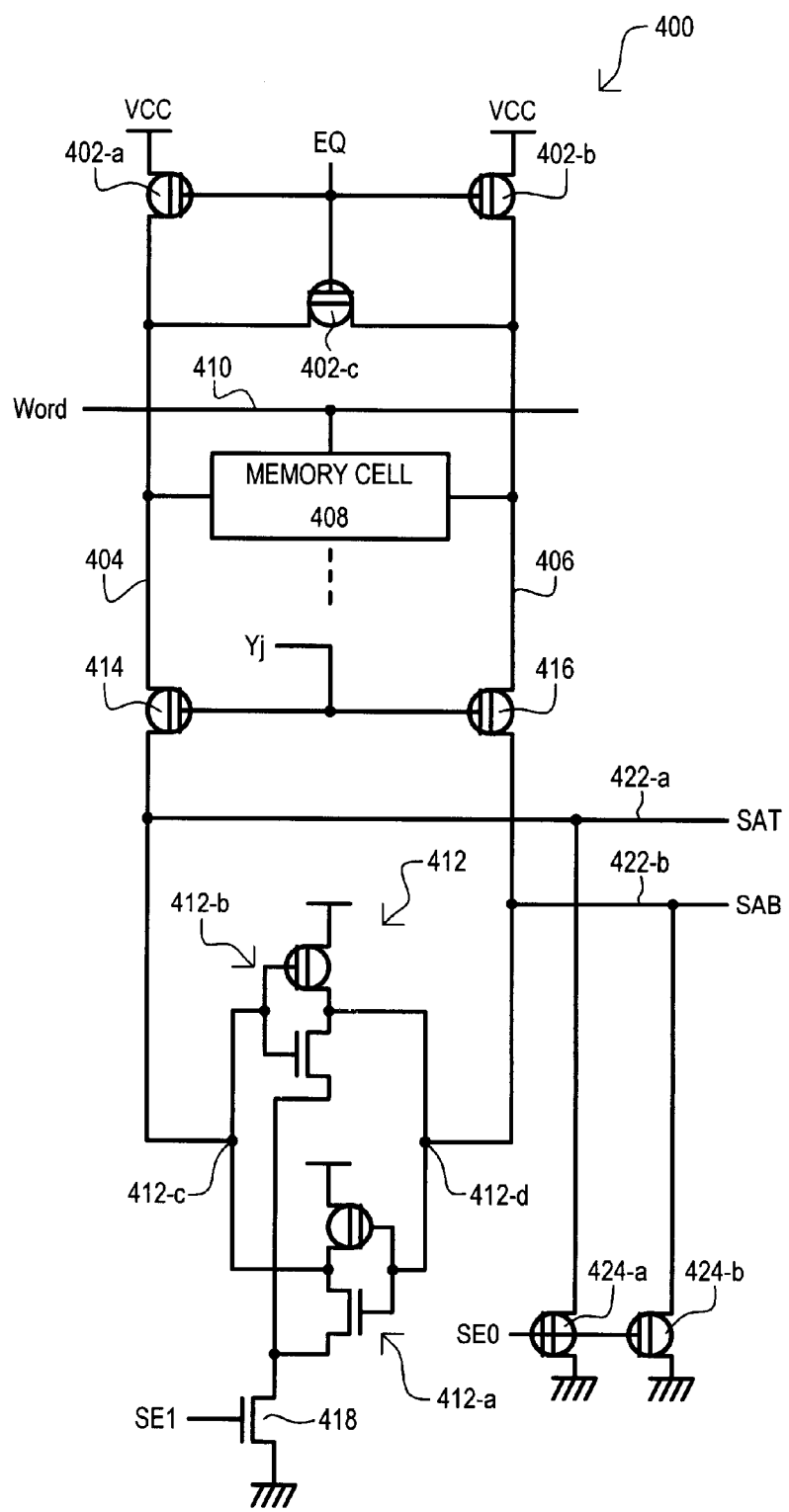
FIG. 4 is a circuit block diagram of a second embodiment.

Referring now to FIG. 4, a second embodiment is set forth in a circuit diagram. A second embodiment 400 may include some of the same general constituents as the first embodiment 100. To that extent, like constituents are referred to by the same reference character but with the first digit being a "4" instead of a "1".

The second embodiment 400 may differ from the first embodiment 100 in that switching devices 424-*a* and 424-*b* may include p-channel IGFETs. P-channel transistors may advantageously prevent the potential at sense amplifier inputs 412-*a* and 412-*b* from dropping excessively in potential. In particular, the potential of the sense amplifier inputs can be clamped to a level of a p-channel threshold voltage above a low power supply (GND).

Figure 5:
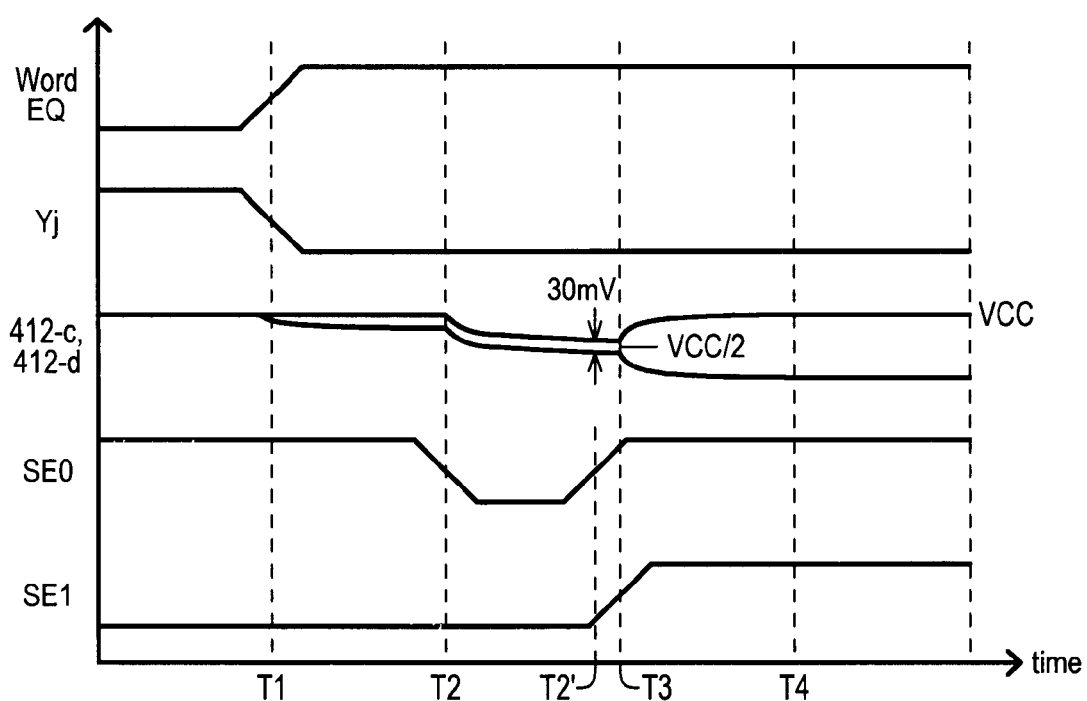
FIG. 5 is a timing diagram illustrating the operation of the second embodiment.
Figure 6:
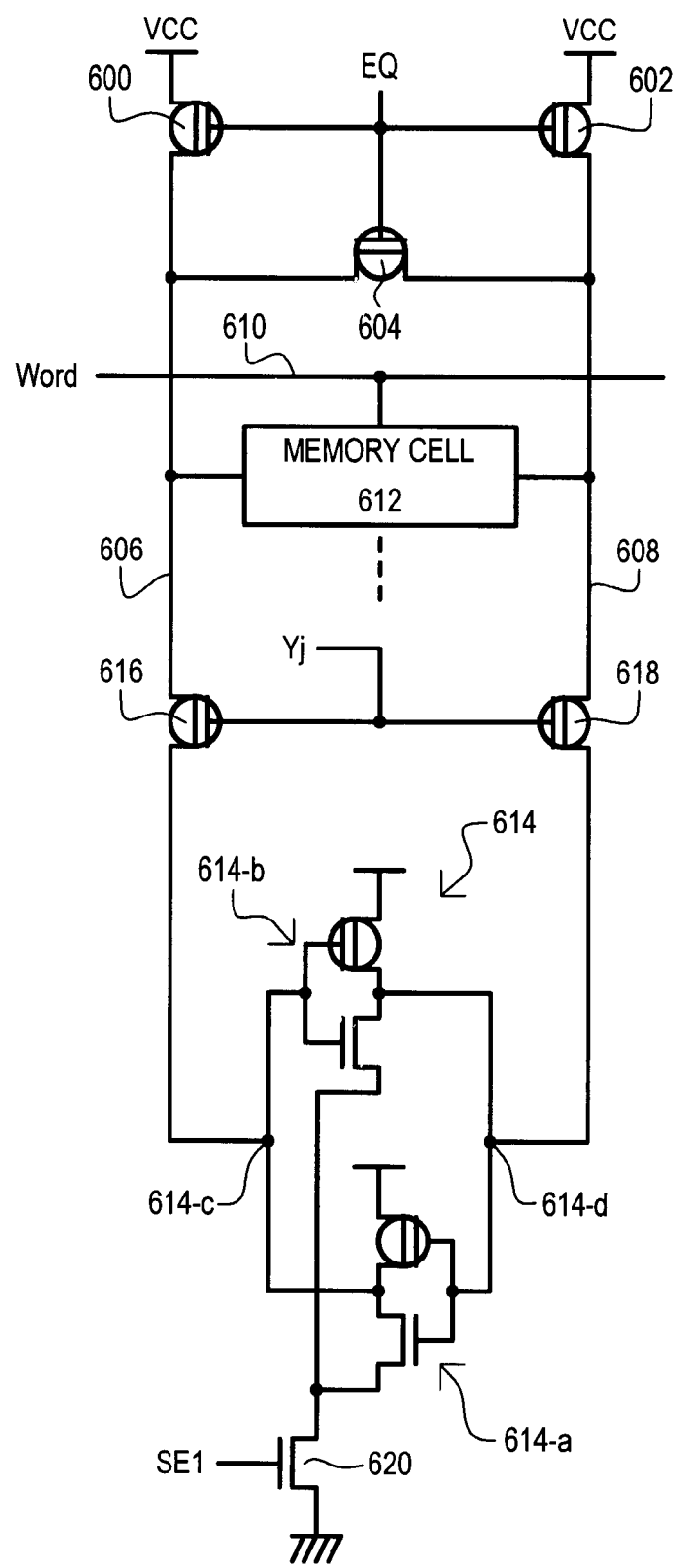
FIG. 6 is a circuit diagram of a conventional memory device.

FIG. 5 is a timing diagram showing the response of various signals and nodes in a read operation of the second embodiment 400. The responses of FIG. 5 include the same waveforms as FIG. 2. However, because the second embodiment includes switching devices 424-*a* and 424-*b* that are p-channel IGFETs, the sense enable pulse SE0 is a high-to-low pulse instead of a low-to-high pulse.

It is understood that while the first and second embodiments have described n-channel and p-channel IGFET switching devices, other devices may be employed to alter the potential at the sense amplifier inputs and/or digit lines.

The present invention may also be conceptualized as a control method for a semiconductor storage device. More particularly a control method for a semiconductor storage device that includes a digit line, a memory cell that places a data signal on the digit line when selected, a sense amplifier coupled to the digit line, and a switch circuit coupled between the digit line and the sense amplifier.

The control method may include a number of steps. First, the memory cell may be selected and the switch circuit may be turned on. Second, the activation of the switch circuit may pull the digit line toward a predetermined potential. As but one example, a switch circuit may pull a digit line toward a low power supply potential. Third, changes in the digit line potential may be stopped. As but one example, the switch circuit may be deactivated. Fourth, the resulting digit line potential may be an optimal sense potential. As but one example, a digit line may be pulled from a high power supply potential VCC to a sense potential of VCC/2.

A method may include additional steps. As a fifth step, the sense amplifier may amplify the potential on the digit line. For example, a sense amplifier may amplify a voltage differential between the digit line and another complementary digit line.

Thus, according to the various described embodiments, the speed of a semiconductor storage device may be increased. In particular, the read time of a high-speed semiconductor storage device may be improved.

It is understood that while various references have been made to a high power supply potential (VCC) and a low power supply potential (GND), such power supply potentials are not necessarily the same potentials as an external power supply voltage. As but one example, a semiconductor storage device may generate one or more internal power supply voltages that are less than or greater than external power supply voltages.

It is also understood that while the various embodiments have described digit lines that are precharged high and pulled low by switch circuits, alternate arrangements could include digit lines that are precharged to a low level, and pulled high by switch circuits.

Still further, while the embodiments have described memory cells that provide complementary data outputs, "single" sided embodiments could be included. As but one example, an alternate embodiment could include a memory cell connected to a single digit line that is connected to a sense amplifier input. Switch circuits could be used to alter the potential of the sense amplifier input as well as a reference potential input to the sense amplifier.

Thus, it is understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor device, comprising:
at least one digit line;
at least one memory cell coupled to the digit line;
a sense amplifier coupled to the digit line at a first sense amplifier input, the sense amplifier amplifying data signals from the memory cell; and
at least one switch circuit coupled to the first sense amplifier input, the switch circuit providing a low impedance path to a first potential after and not before the memory cell places data on the digit line and prior to the activation of the sense amplifier.

2. The semiconductor device of claim 1, wherein:
the at least one switch circuit includes a switch transistor that provides a low impedance path to a low power supply node.

3. The semiconductor device of claim 2, wherein:
the switch transistor includes an n-channel insulated gate field effect transistor (IGFET).

4. The semiconductor device of claim 2, wherein:
the switch transistor includes a p-channel IGFET.

5. The semiconductor device of claim 2, wherein:
the switch transistor includes a bipolar transistor.

6. The semiconductor device of claim 1, wherein:
the switch circuit is enabled by a pulse signal having a predetermined duration.

7. The semiconductor device of claim 1, wherein:
the at least one digit line includes a digit line pair coupled to the memory cell and the first and a second sense amplifier input; and
the switch circuit includes a pair of switch transistors that connect the first and second sense amplifier inputs to a predetermined potential for a predetermined duration after the memory cell places data on at least one digit line and prior to the activation of the sense amplifier.

8. A method of controlling a semiconductor storage device, comprising the steps of:
placing at least one digit line at a precharge potential;
placing memory cell data on the digit line; and
coupling the digit line to a first potential for a predetermined duration to place the at least one digit line at a sense potential that is between the precharge potential and the first potential.

9. The method of claim 8, wherein:
placing at least one digit line at the precharge potential includes placing the digit line at a high supply potential.

10. The method of claim 8, wherein:
coupling the digit line to the first potential includes activating a switch circuit connected to a first supply potential, the sense potential being about halfway between the first supply potential and a second supply potential.

11. The method of claim 8, further including:
amplifying data on the digit line.

12. The method of claim 11, further including:
de-coupling the digit line from the first potential prior to amplifying data on the digit line.

13. The method of claim 8, wherein:
placing at least one digit line at a precharge potential includes placing a digit line pair at the precharge potential;
placing memory cell data on the digit line includes generating a differential voltage on the digit line pair; and
coupling the digit line to a first potential includes coupling the digit line pair to the first potential for a predetermined duration to place the digit line pair at about the sense potential.

14. A semiconductor device, comprising:
a plurality of digit line pairs;
a plurality of memory cells coupled to the digit line pairs;
a plurality of sense amplifiers coupled to the digit line pairs, each sense amplifier including a pair of sense amplifier inputs; and a switch circuit coupled between the sense amplifier inputs and a first potential that adjusts the sense amplifier inputs to a potential that is different than the first potential only after memory cell data has been placed on the digit line pairs.

15. The semiconductor device of claim 14, wherein:

the switch circuit couples the sense amplifier inputs to the first potential for a predetermined time period.

16. The semiconductor device of claim 15, wherein:

the switch circuit couples the sense amplifier inputs to the first potential prior to the sense amplifiers amplifying memory cell data on the digit line pairs.

17. The semiconductor device of claim 14, wherein:

the switch circuit comprises insulated gate field effect transistors.

18. The semiconductor device of claim 14, wherein:

the switch circuit comprises bipolar transistors.

19. The semiconductor device of claim 14, wherein:

the plurality of digit line pairs are precharged to a second potential; and the switch circuit adjusts the sense amplifier inputs to a potential that is approximately halfway between the first potential and the second potential.

\* \* \* \* \*